US008796907B2

(12) United States Patent
Galchev et al.

(10) Patent No.: US 8,796,907 B2
(45) Date of Patent: Aug. 5, 2014

(54) INCREASED FREQUENCY POWER GENERATION USING LOW-FREQUENCY AMBIENT VIBRATIONS

(75) Inventors: Tzeno Galchev, Ann Arbor, MI (US); Hanseup Kim, Salt Lake City, UT (US); Khalil Najafi, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 795 days.

(21) Appl. No.: 12/818,716

(22) Filed: Jun. 18, 2010

(65) Prior Publication Data

US 2011/0140577 A1 Jun. 16, 2011

Related U.S. Application Data

(60) Provisional application No. 61/218,656, filed on Jun. 19, 2009.

(51) Int. Cl.
*H02K 35/00* (2006.01)

(52) U.S. Cl.
USPC .......... 310/339; 310/319

(58) Field of Classification Search
USPC .......... 310/339, 329, 319, 26, 29, 330, 311, 310/328, 12.12, 15, 35, 14, 17, 21, 24, 25, 310/36; 290/1 R
IPC .......... H01I 41/08; H02N 2/00
See application file for complete search history.

(56) References Cited

U.S. PATENT DOCUMENTS

| | | | | |
|---|---|---|---|---|
| 6,768,246 | B2 * | 7/2004 | Pelrine et al. | 310/339 |
| 7,579,757 | B2 | 8/2009 | Kulah et al. | |
| 7,816,799 | B2 * | 10/2010 | Nair et al. | 310/26 |
| 8,212,436 | B2 * | 7/2012 | Nair et al. | 310/339 |
| 8,410,667 | B2 * | 4/2013 | Rastegar et al. | 310/339 |
| 2007/0284969 | A1 | 12/2007 | Xu | |
| 2008/0079333 | A1 | 4/2008 | Ulm et al. | |
| 2008/0258581 | A1 * | 10/2008 | Schmidt | 310/348 |
| 2009/0322184 | A1 | 12/2009 | Carman et al. | |

FOREIGN PATENT DOCUMENTS

| | | |
|---|---|---|
| KR | 10-2006-0062604 | 6/2006 |
| KR | 2008-0070629 | 7/2008 |
| WO | WO 2006/059822 A1 | 6/2006 |

OTHER PUBLICATIONS

Tzeno Galchev, et al. "A Piezoelectric Frequency-Increased Power Generator for a Scavenging Low-Frequency Ambient Vibration", 4 pages.

(Continued)

*Primary Examiner* — Thomas Dougherty
*Assistant Examiner* — Karen B Addison
(74) *Attorney, Agent, or Firm* — Reising Ethington P.C.

(57) ABSTRACT

An increased frequency power generator that includes a pair of transducers located on opposite sides of a suspended inertial mass. Magnetic attraction is used to couple the mass to each of the two transducers in alternating fashion in response to vibration and other movement externally imparted on the generator. Each transducer includes a suspended magnetic element that couples and decouples to the inertial mass as it reciprocates in the housing due to the applied external moving force. As the inertial mass decouples from one transducer on its way to magnetically connecting to the other transducer, the decoupled suspended magnetic element oscillates at a frequency greater than the imparting force, thereby generating electrical power.

18 Claims, 17 Drawing Sheets

20 35 32 30 37 38 28 36 24 26 46 48 40 47 22 42 45 N S N S N S

TRANSDUCER VOLTAGE
MAGNETIC FORCE
DISPLACEMENT
TIME

(56) References Cited

OTHER PUBLICATIONS

Tzeno Galchev, et al. "A Paramedic Frequency Increased Power Generator for Scavenging Low-Frequency Ambient Vibrations", Proceedings of the Eurosensors XXIII Conference, www.sciencedirect.com, Procedia Chemistry 00 (2009) 000-000, 4 pages.

Carver, Adam, CFA, et al., "Enertia Powering your Wireless Future", info@EnertiaEnergySystems.com, 31 pages.

International Search Report for PCT/US2010/039183, Feb. 7, 2011, 3 pages.

* cited by examiner

INCREASED FREQUENCY POWER GENERATION USING LOW-FREQUENCY AMBIENT VIBRATIONS

CROSS-REFERENCE TO RELATED APPLICATION

This application claims the priority of U.S. Provisional Patent Application No. 61/218,656, filed Jun. 19, 2009, the contents of which are hereby incorporated by reference.

STATEMENT REGARDING FEDERALLY SPONSORED RESEARCH

This invention was made with government support under EEC-9986866 awarded by the National Science Foundation. The government has certain rights in the invention.

TECHNICAL FIELD

The invention relates generally to power scavenging and, more particularly, to electrical energy harvesting from low frequency ambient mechanical vibrations using a non-resonant electrical power generator.

BACKGROUND OF THE INVENTION

As the number and variety of microelectronic and other low power devices continues to grow, so too the need for sources of power to run these devices. Wireless sensors, implantable devices, and other low-power gadgets typically obtain operational power in one of two ways: 1) by using electrochemical batteries or micro fuel cells and 2) by energy scavenging from environmental sources such as ambient heat, light, and vibration. Although electrochemical batteries and fuel cells can provide more power, they are not desirable for some applications due to their limited lifetime, size, and/or weight.

Energy scavenging is becoming more feasible because miniaturization and other technological advances have reduced power consumption. It is now possible to power at least some of these low power devices using harvested ambient energy in lieu of electrochemical sources such as batteries. Wireless microsystems and sensors have become so energy efficient that there are now viable designs that can scavenge sufficient operating energy from their surroundings. Vibration, or ambient kinetic energy, is one such source of ambient energy that abundant; for example, man-made machinery vibrates, trees sway in the wind, and of course humans produce an abundant amount of motion. However, most research and commercial efforts to develop vibration scavengers have focused around a single technological implementation: resonant generators. In other words, they are designed to harness energy coming in at a single steady frequency. These devices take advantage of an inherent mechanical amplification that occurs when the resonant frequency of the device is matched to the input vibration frequency. The use of resonance-based generators can have some drawbacks, however, such as the need to be tuned to their environment and the difficulty in scaling these devices when the vibration frequency decreases, both in terms of size and power density.

SUMMARY OF THE INVENTION

In accordance with one embodiment of the invention, there is provided an electrical power generator, comprising a housing and an inertial mass and transducer mounted in the housing. The inertial mass is capable of at least limited movement within the housing in response to vibration of the housing. The transducer is coupled to the inertial mass such that the transducer undergoes oscillatory motion in response to the movement of the inertial mass resulting from the vibration.

In accordance with another embodiment of the invention, there is provided an increased frequency power generator which includes a housing, an inertial mass mounted in the housing, and first and second transducers mounted in the housing. The inertial mass is capable of at least limited movement within the housing in response to low frequency vibration of the housing. The first transducer is positioned within the housing adjacent a first side of the inertial mass and the second transducer is positioned within the housing adjacent a second side of the inertial mass, wherein the inertial mass is suspended within the housing between the first and second transducers such that the inertial mass can be magnetically coupled to only one of the transducers at a time and is capable of alternately coupling and decoupling with each transducer in response to the vibration imparted on the housing. The transducers each includes at least one magnetic element suspended within the housing for oscillatory movement upon decoupling of the inertial mass from that transducer. Each suspended magnetic element vibrates upon decoupling at a frequency that is greater than the low frequency vibration. In this way, low frequency vibration or other movement of the generator can be used to create higher frequency motion in the device that is used to generate electrical power.

BRIEF DESCRIPTION OF THE DRAWINGS

One or more preferred exemplary embodiments of the invention will hereinafter be described in conjunction with the appended drawings, wherein like designations denote like elements, and wherein:

FIG. 10(*b*) is a photograph showing a partially assembled transducer used in the IFPG of FIG. 9 along with various copper suspension spring designs;

FIG. 12(*b*) depicts partial operation of the IFPG of FIG. 11;

FIG. 16(*b*) is a photograph showing the piezoelectric beam used in the transducers of the IFPG of FIG. 11.

DETAILED DESCRIPTION OF THE PREFERRED EMBODIMENTS

Figure 1B:
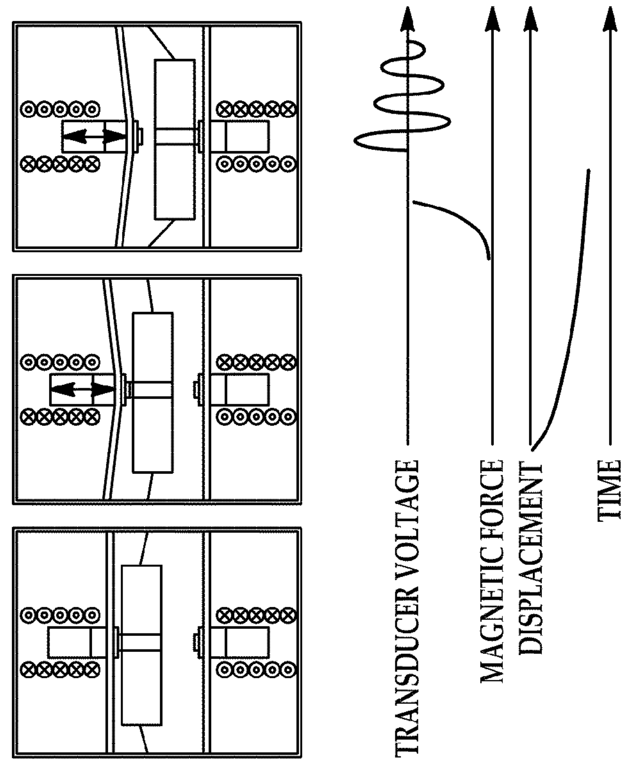
FIG. 1B depicts partial operation of the IFPG of FIG. 1.

Described herein are various embodiments of an electrical power generator that scavenges energy from mechanical vibrations and other direction-changing motion. The illustrated embodiments provide an increased-frequency oscillatory motion within the device that is used by an embedded transducer to convert the induced higher frequency motion to electrical power. This enables the device to extract energy from low frequency ambient motion using mechanical transduction that involves higher frequency resonant mechanical systems. It also enables the device to work with non-periodic and even transient non-vibratory motion that at least involves direction-changing motion.

In general, each of the illustrated embodiments depict an electrical power generator that includes a housing, an inertial mass mounted in the housing, and one or more transducers that generate electrical power in response to movement of the inertial mass. Low frequency vibrations or other direction-changing movement that is imparted on the housing causes movement of the inertial mass. This movement can be coupled to the transducer in any of a variety of different ways to cause oscillatory motion of the transducer that is converted by the transducer to electrical power. A first embodiment 20 is shown in FIG. 1A and uses a bi-stable mechanical structure to initiate high-frequency mechanical oscillations in an electromagnetic scavenger. This method of operation allows the device 20 to operate in a non-resonant fashion, yielding an increased bandwidth. The reduced electromechanical coupling at low frequencies is addressed by using frequency up-conversion between the ambient vibration and the internal generator motion. Thus, for example, the device 20 can be designed to respond to low frequency ambient vibrations of less than 100 Hz by creating internal oscillations that are one or more orders of magnitude greater in frequency than the ambient vibrations.

As shown in FIG. 1A, the increased-frequency power generator (IFPG) 20 utilizes a housing 22, suspended inertial mass 24, and two electromagnetic transducers 30, 40 that are located on opposite sides of the inertial mass 24. The transducers operate as electromagnetic harvesters having a resonant frequency greater than the targeted input vibrations. Each transducer 30, 40 includes a respective coil 32, 42 that is fixed within the housing 22 and a respective magnetic core 34, 44 that is suspended within the housing 22 such that each magnetic core can undergo oscillatory motion within its respective coil so as to induce an electrical current in the coil. The core 34, 44 of each transducer 30, 40 includes a respective magnet 35, 45 and ferromagnetic pad 36, 46 that permits its associated core to be attracted to a magnet 26 mounted at the center of the inertial mass 24. When used, each pad 36, 46 can be attached directly to its associated magnet 35, 45; or, as in the illustrated embodiment, each pad 36, 46 can be attached indirectly by way of a respective spacer 37, 47 that forms a part of the core 34, 44. The inertial mass 24 and cores 34, 44 can be suspended within the housing 22 in any suitable manner, such as by way of respective suspension springs 28, 38, 48. The three magnets 26, 34, 44 shown in FIG. 1A can be rare earth (e.g., NdFeB) or other suitable magnets. The two transducers 30, 40 and inertial mass 24 are all located co-linearly along a single axis such that the IFPG 20 responds to components of ambient vibrations that are parallel to that axis.

Figure 1A:
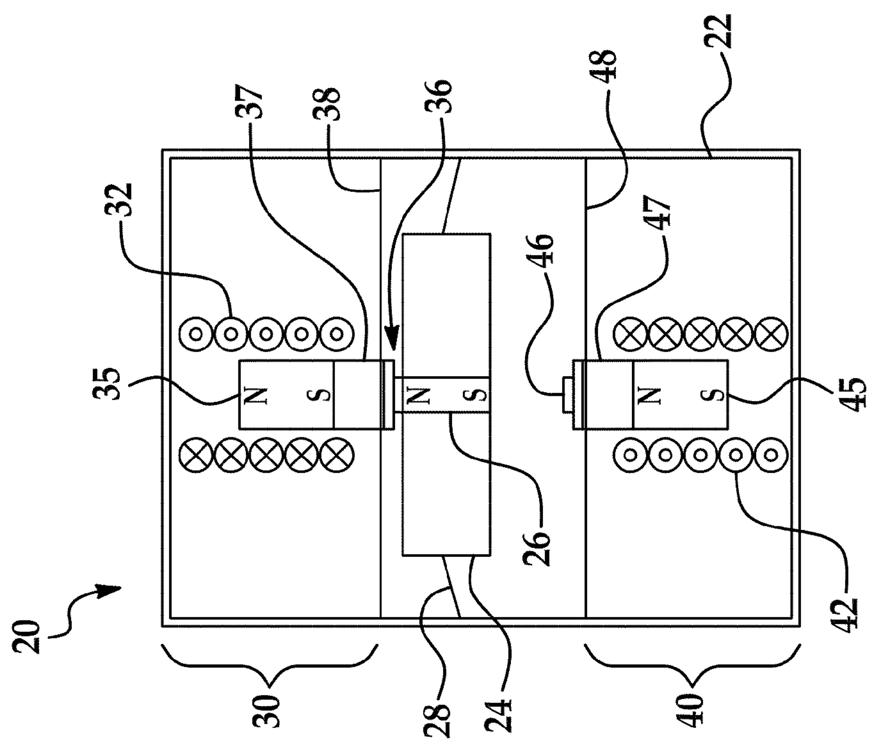
FIG. 1A is a diagrammatic cross-sectional view of a first embodiment of an increased frequency power generator (IFPG) constructed in accordance with the invention.

The operation of the IFPG 20 is outlined in FIG. 1B. The generator 20 operates such that the inertial mass 24 snaps back and forth between the two transducers 30, 40 in response to ambient motion imposed on the housing 22. As shown in the first step of FIG. 1B, when the inertial mass 24 nears one of the transducers (e.g., upper transducer 30), it attaches to the ferromagnetic pad 36 by magnetic attraction between the pad 36 and the center magnet 26 at the inertial mass 24. Magnetic attraction from the transducer's core magnet 35 can also contribute to this attraction and magnetic retention. Once the ambient motion imparted on the housing 22 is sufficient to cause the inertial mass 24 to move back towards the other transducer (lower transducer 40), the mass 24 pulls on the suspended, magnetically-attached core 34 from transducer 30. This is shown in the second depicted step of FIG. 1B. As the inertial mass 24 approaches the opposing transducer 40, the magnetic force of attraction between the center magnet 26 of the inertial mass and the pad 46 of transducer 40 begins to increase exponentially when a certain gap is reached, providing added acceleration on the inertial mass 24 towards that second transducer 40. At this instance the inertia of the mass 24 and the magnetic attraction to transducer 40 overwhelm the magnetic holding force between the center magnet 26 and the pad 36 of transducer 30 so that they separate as the inertial mass 24 attaches to the lower transducer 40. This is shown in the third step of FIG. 1B. The freed upper transducer 30 now resonates at its high natural frequency converting the stored mechanical energy to electrical. This process is subsequently repeated in the opposite direction.

Figure 2:
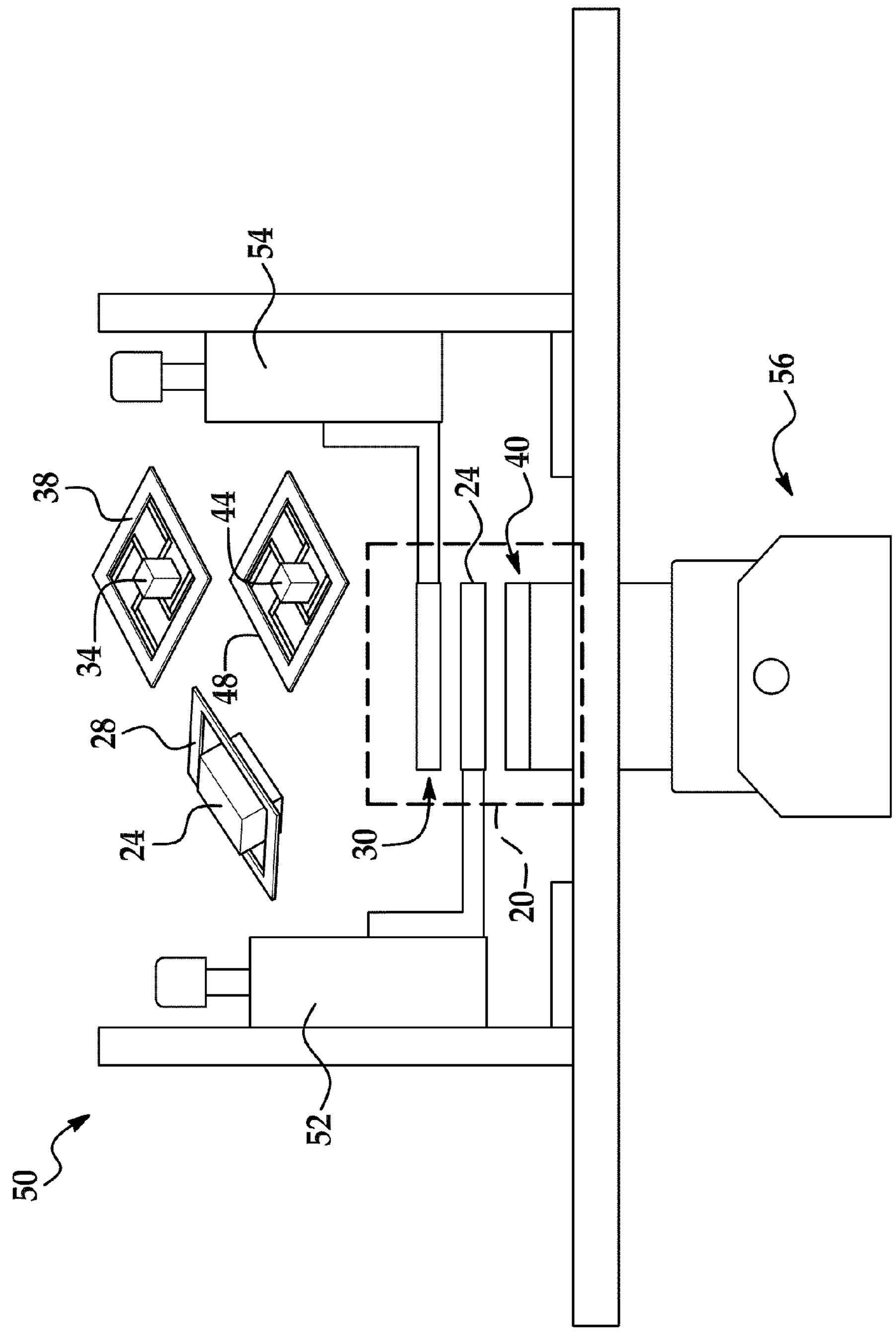
FIG. 2 is a diagram of a test setup for testing and characterization of the transducers used in the IFPG of FIG. 1, and it includes a perspective diagrammatic view of the suspended inertial mass and transducer cores used in the IFPG of FIG. 1.
Figure 3A:
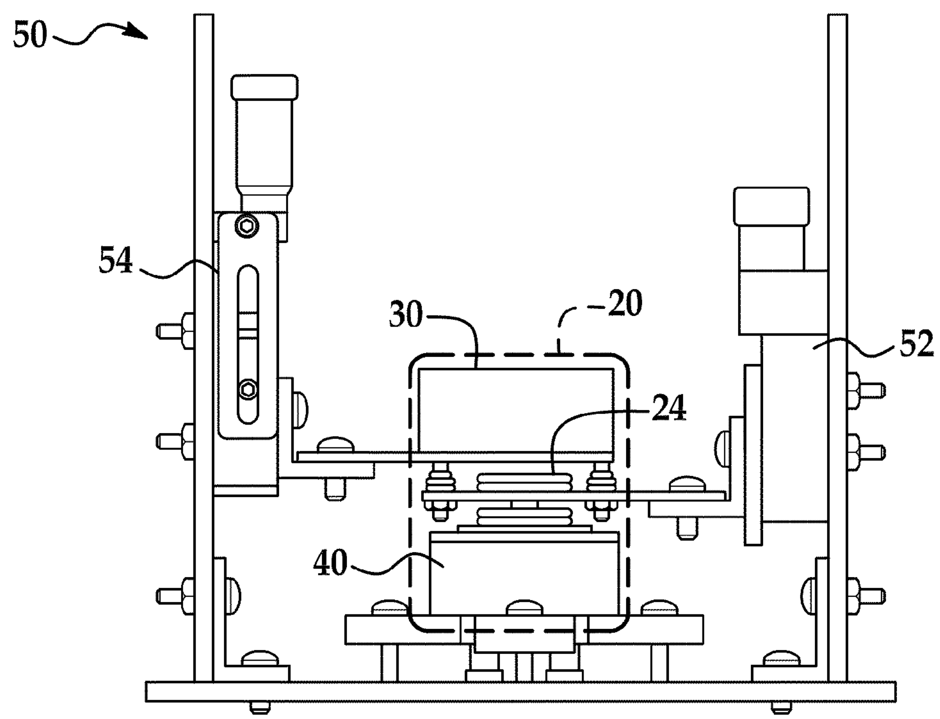
FIG. 3A depicts more detail of the test setup of FIG. 2.
Figure 3B:
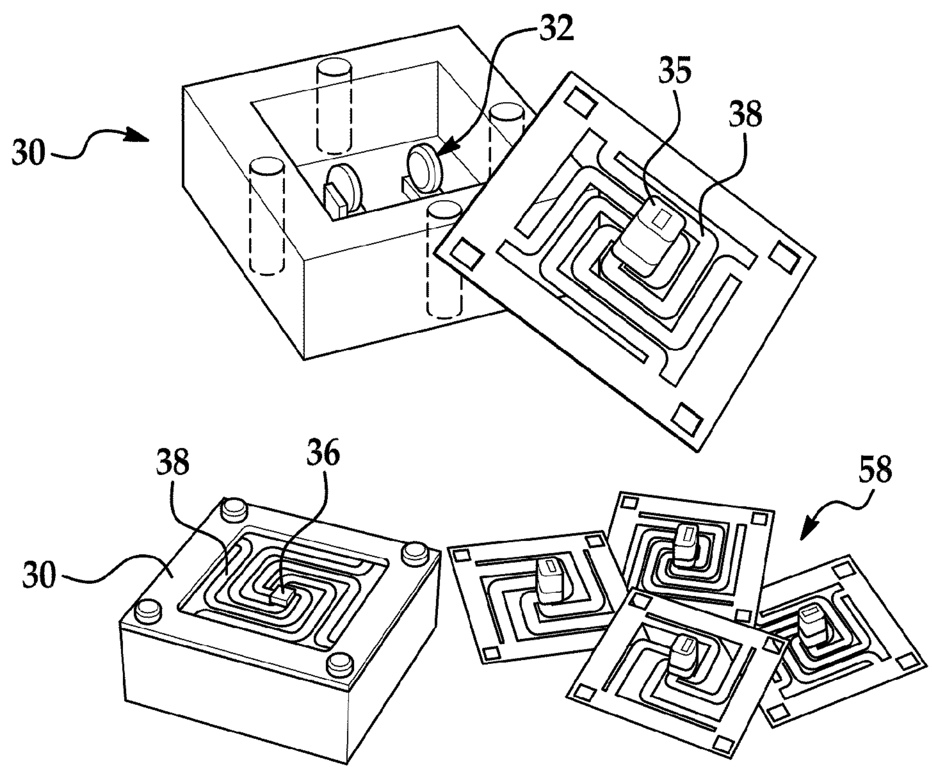
FIG. 3B shows one of the transducers depicted in FIG. 3A both open and fully assembled, and shows various alternative suspension spring designs.

A prototype of IFPG 20 was fabricated and assembled to test out the above design. Spring suspensions 28, 38, 48 for the inertial mass 24 and both the transducers 30, 40 were fabricated out of 127 μm thick copper alloy 110. The copper sheets were mounted on carrier silicon wafers using photoresist, lithographically patterned, and immersion etched in $FeCl_2$ at 45° C. NdFeB magnets were bonded to the inertial mass and transducer springs using cyanoacrylate. Small 2×2 mm pieces of stainless steel were used for the ferromagnetic pads. The transducer coils were wound from 50 μm diameter enameled copper wire. The transducers and inertial mass were mounted within a specially machined acrylic housing, and the spring was clamped in place using a screwed in aluminum ring. The fabricated generator 20 was put together on a hybrid assembly 50, shown diagrammatically in FIG. 2, such that the relative spacing of each of the three suspended components could be adjusted in the z-direction using micropositioners 52, 54. This fixturing of the device gives flexibility in interchanging components, characterizing the influence of and optimizing various parameters, and validating theoretical modeling of the system. The fabricated test setup and mounted IFPG are shown also in FIG. 3A. FIG. 3B shows a close-up of various components of transducer 30, revealing the coil(s) 32 (two used in this embodiment of transducer 30), magnet 35, as well as the final assembled device 30 which has width and length dimensions of about 1.5 inches in each direction. Transducer 40 was constructed in the same manner. Various copper spring designs 58 are also shown. The entire test jig of FIG. 3A was then mounted on a shaker system 56 (FIG. 2) for vibration testing.

Figure 4:
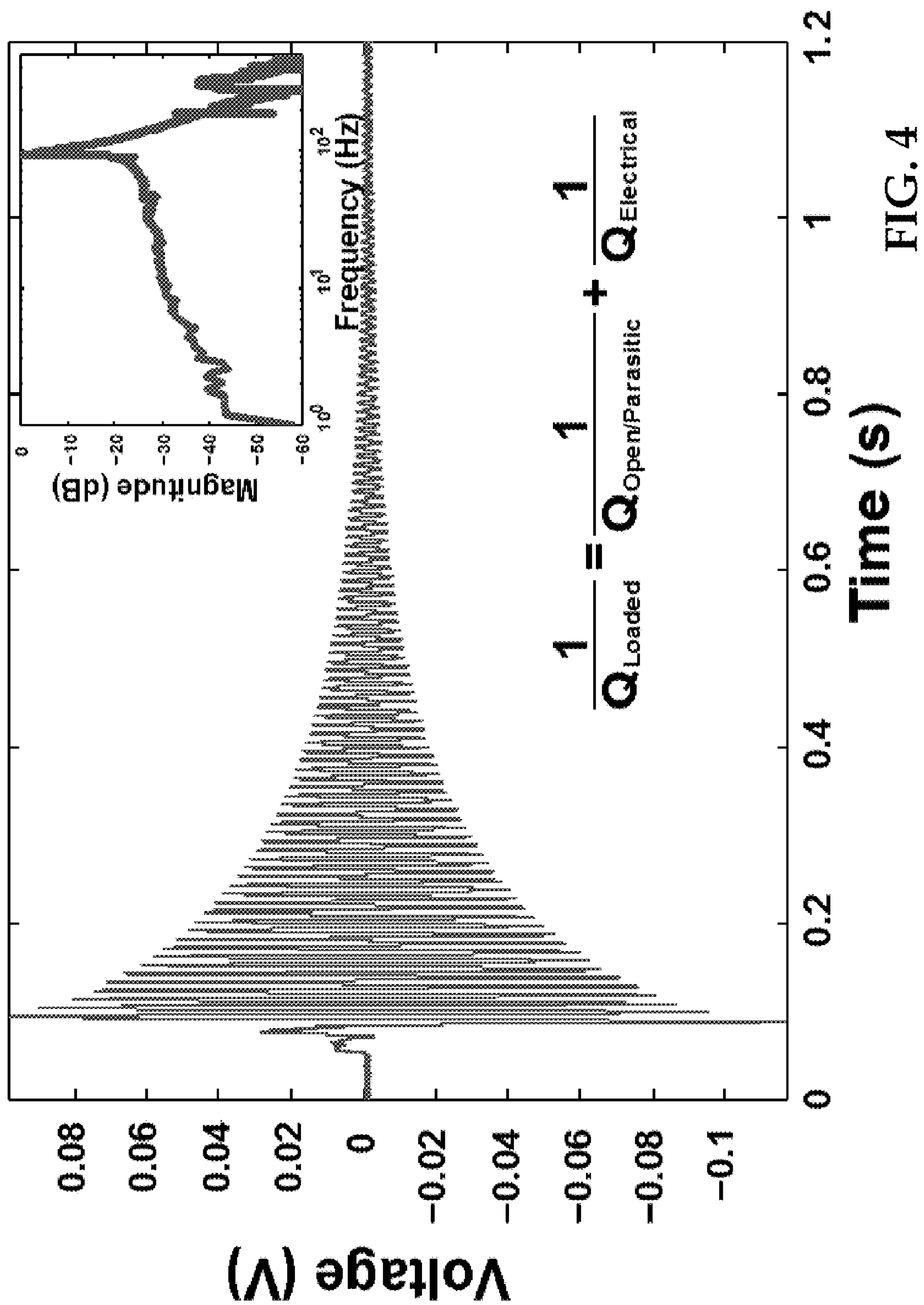
FIG. 4 shows a characteristic impulse response for one of the transducers used in the IFPG of FIG. 1.

Initial testing was performed to characterize the IFPG device 20 using different ones of the springs 58. Each IFPG was mounted on the test setup and actuated by providing an impulse using the area for magnetic actuation. Waveform traces of the generated output voltage were used to determine the natural frequency of the device, as well as to investigate the parasitic damping and electromechanical coupling of the system. These parameters can be extracted by processing the waveform to determine the frequency response. The impulse response of FIG. 4 shows one such dataset. The frequency response was computed by taking the Discrete Fourier Transform of the voltage signal. Open circuit and loaded impulse response measurements were made, and the equation in FIG. 4 was used to determine the electromechanical coupling quality factor $Q_e$. Table I shows a summary of the measured parameters for various springs using the transducer 40.

TABLE I

Transducer 40 Summary

| | |
|---|---|
| Mass | 1.2 g |
| Disp. Limit | 1 mm |
| Coil Turns | 2000 |
| Coil Resistance | 295 Ω |
| Magnet | NdFeB 4.5 × 4.5 × 4.5 mm |

| | k* (N/m) | $f_o$ (Hz) | $Q_p$ | $Q_e$ |
|---|---|---|---|---|
| Spring 1 | 559 | 103 | 61 | 94 |
| Spring 2 | 787 | 115 | 66 | 96 |
| Spring 3 | 1053 | 137 | 61 | 138 |
| Spring 4 | 1169 | 145 | 54 | 148 |

*Denotes Simulated Value

Figure 5:
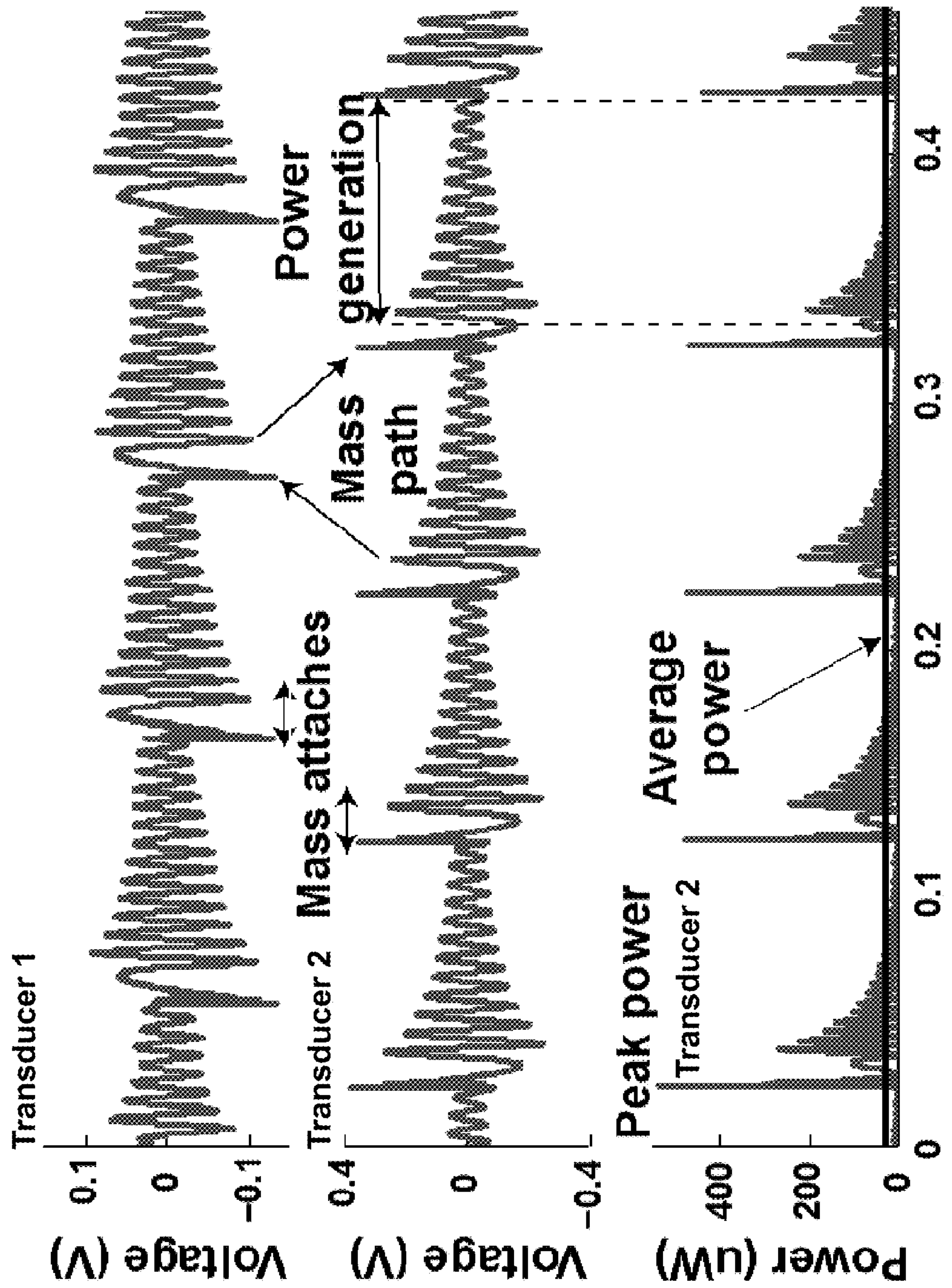
FIG. 5 shows voltage waveforms for the tested IFPG of FIG. 1 as well as its output power.

Nominally, the transducer Spring 1 listed in Table I was used for testing. The IFPG was designed for a minimum acceleration of 1 g and was characterized at that level. The minimum frequency at which the generator could be tested accurately is 10 Hz due to limitations associated with the vibration test system. However, the generator could function at lower frequencies, albeit at a reduced power level. Each transducer was loaded with a 270Ω resistor. FIG. 5 shows the operation of the tested IFPG. The top two plots show the voltage generated by each transducer across the load and the bottom plot shows the instantaneous power from transducer 40. One can discern from the voltage plots where the inertial mass attaches to each transducer, and where the mass detaches and travels to the opposing device. It is apparent from this plot that the two transducers devices are not operating symmetrically, and that that top transducer 30 is suboptimal. The main reason for this is that, due to hand assembly of the transducer casing, a larger gap has resulted between the coils and the magnet, decreasing the electromechanical coupling. The higher quality factor of transducer 30 is easily seen in FIG. 5.

Figure 6:
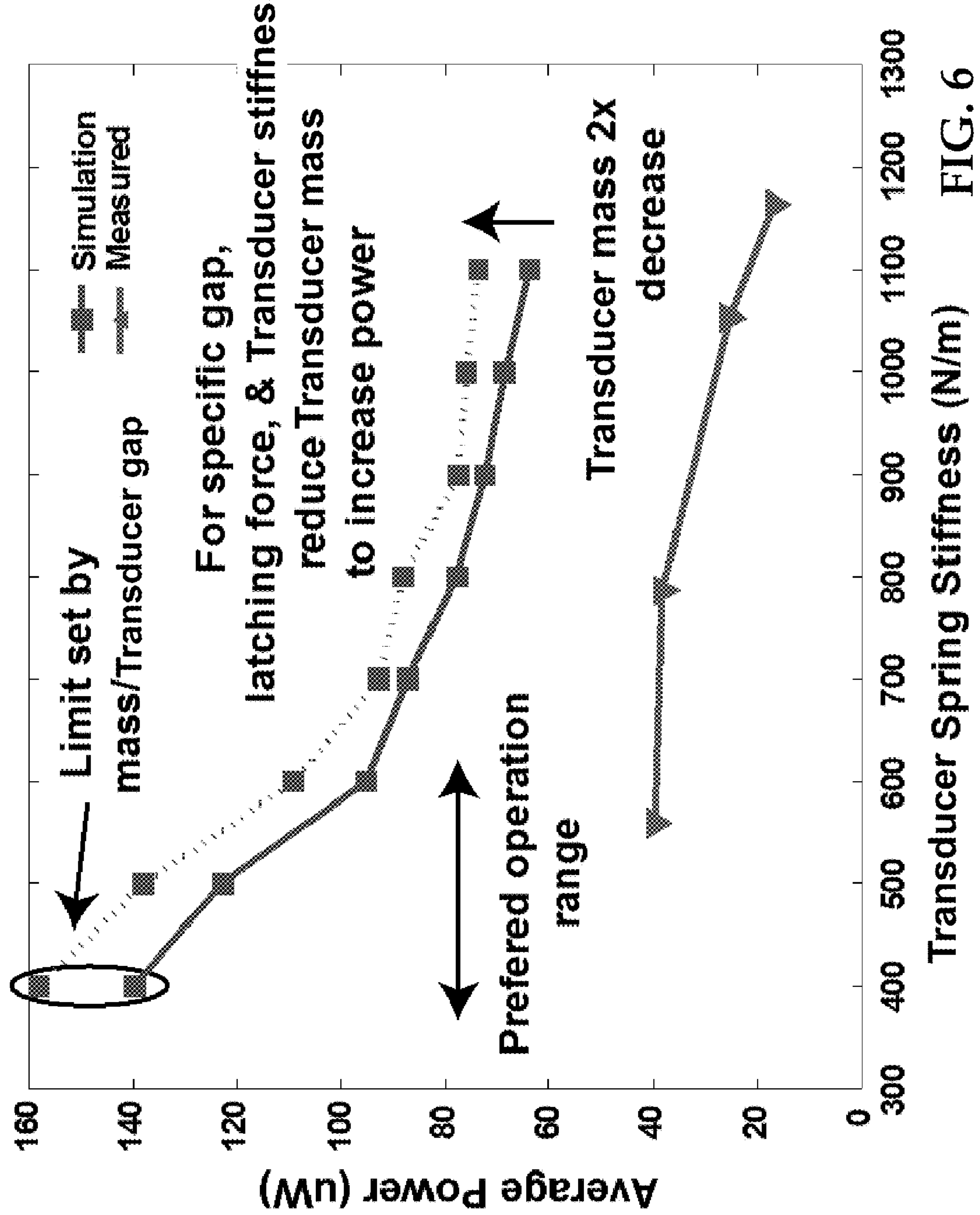
FIG. 6 shows a simulation of the optimal spring stiffness for the embodiment of FIG. 1.

The IFPG generator consists of three spring-mass-damper systems. Many parameters have complex interactions and are of significance to the overall operation and conversion efficiency. The inertial mass size, coupled with the distance between each of the transducers and the magnetic force of attraction, determine the minimum external vibration level needed for operation. For a certain actuation gap and inertial mass, an optimal transducer spring stiffness exists. FIG. 6 shows a simulation of the optimal spring stiffness. Four transducer springs were fabricated to validate this simulation. Measured results using each of those springs are also shown. After determining an optimal spring constant, the transducer mass can be reduced to increase the transducer frequency, thus further enhancing the power generating capability (frequency up-conversion). Since power $\sim mY^2\omega^3$, for a fixed displacement Y, mass can be reduced to increase ω. The simulated increase in power when the mass is cut in half is also shown in FIG. 6.

Figure 7:
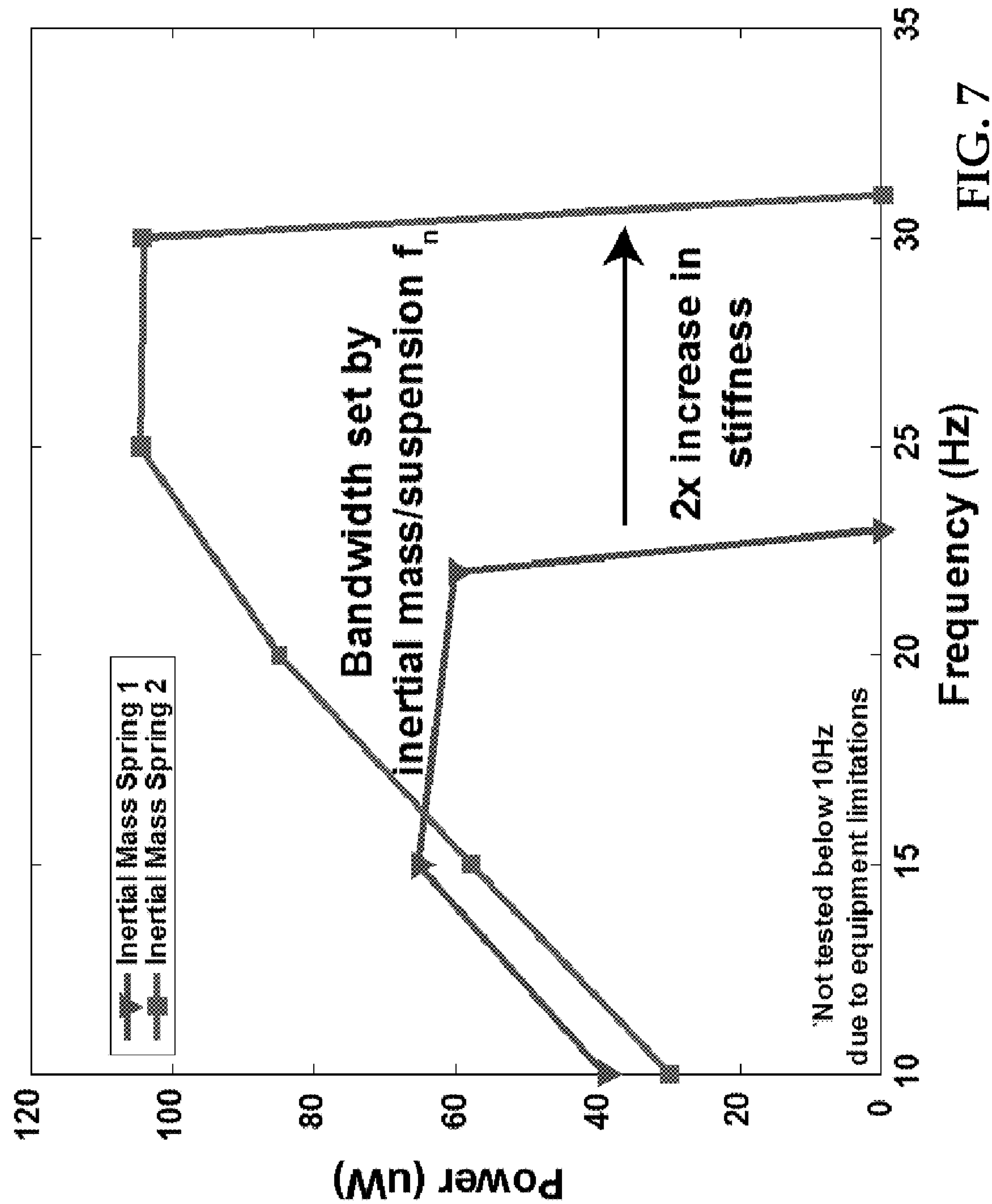
FIG. 7 shows performance of the IFPG of FIG. 1 as a function of frequency.

The bandwidth of the IFPG device is determined by the resonant frequency of the inertial mass and its spring suspension. Above this frequency the inertial mass cannot respond fast enough to the input motion. The device can be designed to operate up to a specific frequency by increasing the spring constant of the inertial mass. FIG. 7 shows the measured performance of the IFPG as the input frequency is increased. By increasing the spring constant of the inertial mass by 2, the IFPG cutoff frequency is increased by a factor of 1.4; from 22 Hz to 31 Hz.

A summary of the prototype IFPG performance is shown in Table II. The device is able to generate an average power of 39 μW (combined Transducers 30 and 40). A functional volume of 3.7 $cm^3$ is calculated for the IFPG device; this includes the volume of all of the components (springs, mass, magnets, and coils) as well as the 'air' volume needed for displacement during operation.

TABLE II

| IFPG 20 Summary | |
|---|---|
| Inertial Mass | 9.63 g |
| Suspension Spring | 67 N/m* |
| Actuation Gap | 2 mm |
| Actuation Magnet | NdFeB, Dia. 1.15 mm, Thk. 0.5 mm |
| Actuation Area | 2 mm × 2 mm |
| Peak Power (1 g, 10 Hz) | 558.2 (μW) |
| Avg. Power (1 g, 10 Hz) | 39.45 (μW) |
| Functional Volume | 3.68 $cm^3$ |
| Average Power Density | 10.7 $\mu W/cm^3$ |

*Denotes Simulated Value

There are a number of ways that the base IFPG design can be modified including: 1) structural changes, 2) different actuation mechanisms, 3) different transduction techniques, and 4) active control of the actuating mechanism.

Figure 8:
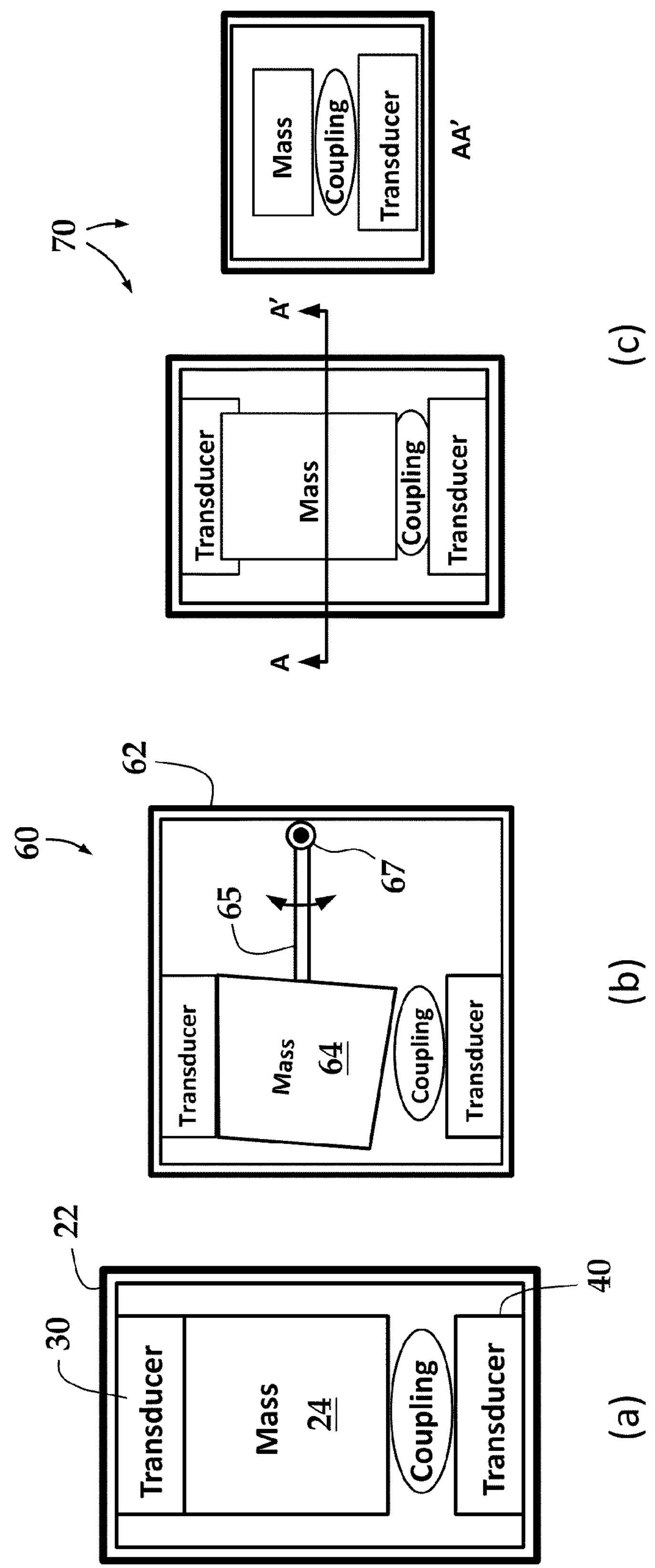
FIG. 8 depicts various alternative embodiments of a IFPG that can be constructed in accordance with the invention.

FIG. 8 outlines some of the major structural changes that can be made. In FIG. 8(*a*) the first embodiment 20 of FIGS. 1-3 is shown, where the inertial mass 24 couples energy from the outside and passes it to the transducers 30, 40 via a latching/coupling mechanism. This device works axially, and all of the components operate along a common axis. Within this basic approach various changes can be made. For example, where a ferromagnetic inertial mass 24 is used with transducer core magnets 35, 45 of sufficient strength, the center magnet 26 at the inertial mass 24 could be eliminated. Alternatively, the transducer coils 32, 42 could be suspended by springs for a moving coil implementation, with the magnetic cores 34, 44 being fixed relative to the housing 22. Other such modifications will become apparent to those skilled in the art.

FIG. 8(*b*) is a modified embodiment 60 wherein the mass 64 is attached to a beam 65 such that the overall mechanical structure has an eccentric center of mass. The beam 65 is either supported on the housing 62 using a hinge or a bearing 67 and able to rotate around its base. The configuration presented in FIG. 8(*b*) is suitable for non-linear vibration.

FIG. 8(*c*) shows another embodiment 70, in which the IFPG is configured such that the transducers and the actuation mass do not move along a common axis or in the same plane. In other words the mass passes over or under one or both transducers and a suitable latching mechanism could be employed. The inertial mass mechanism in these three (and other) embodiments can be spring-loaded or not, and perhaps even submerged in a fluid which acts as the spring/support structure. The energy coupling between the mass and the transducer can be performed via mechanical latching/engagement such that as the mass moves past the transducer it physically pushes it into operation. Also, more or less transducers can be used than that shown.

Figure 9:
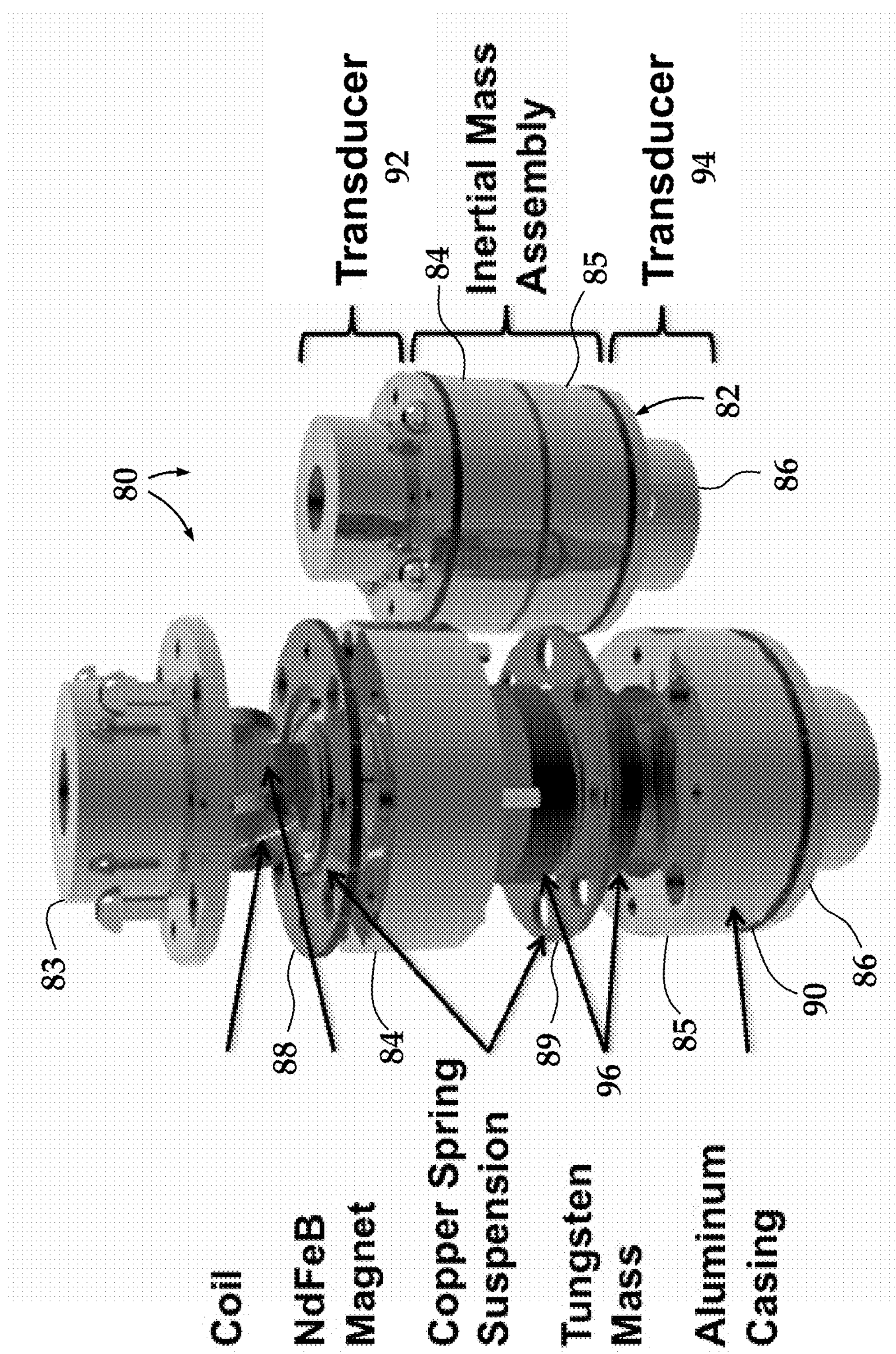
FIG. 9 shows exploded and assembled views of a fourth embodiment of an IFPG constructed in accordance with the invention.
Figure 10:
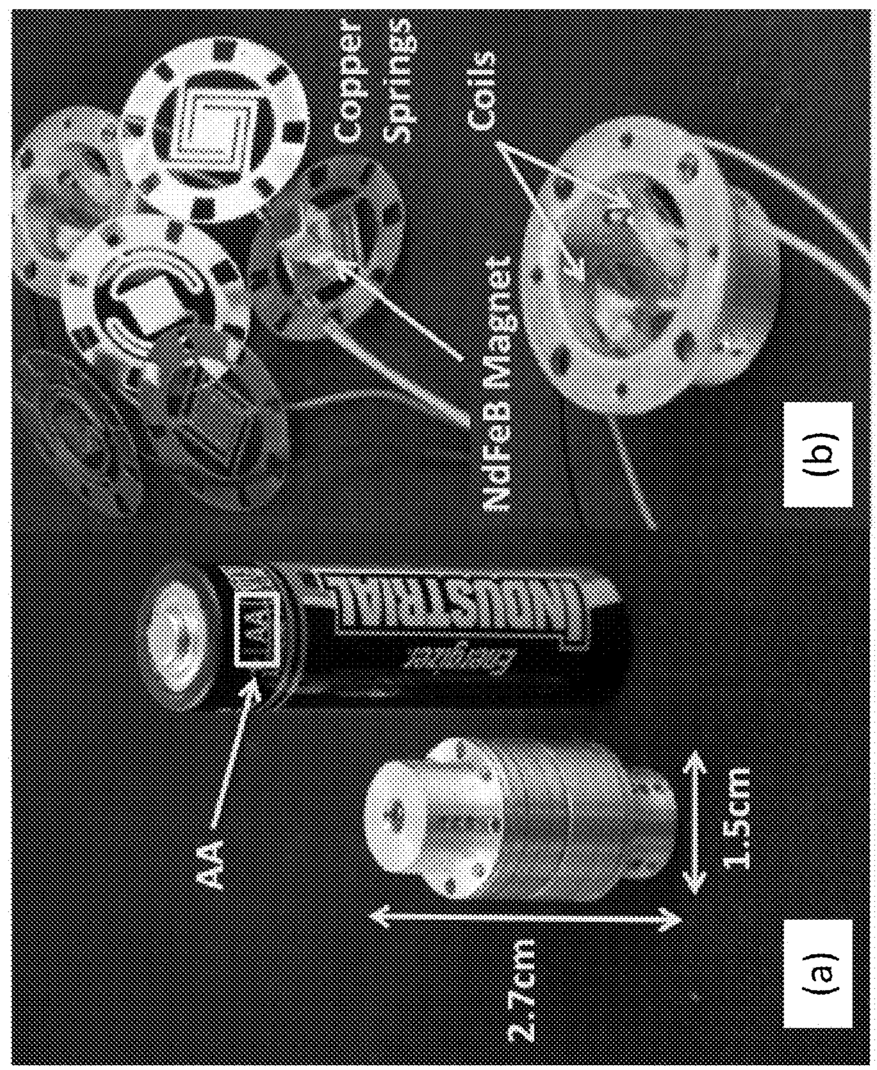
FIG. 10(*a*) is a photograph showing relative size of the assembled IFPG of FIG. 9.

Referring now to FIG. 9, there is shown a fourth embodiment 80 of an IFPG manufactured in a more miniaturized form factor. FIG. 10(*a*) shows a photograph of the manufactured device. The IFPG 80 has a housing 82 milled out of aluminum to leave a 1 mm thick sidewall. It consists of four separate parts 83-86, bolted together during assembly, clamping down the spring suspensions 88-90 in the process. The springs for both the transducers 92, 94 and the inertial mass 96 are fabricated out of 127 μm thick copper alloy 110. The copper sheets are mounted on carrier silicon wafers using photoresist, lithographically patterned, and immersion etched in $FeCl_3$ at 45° C. A NdFeB magnet is adhered to each of the springs 88-90 using cyanoacrylate. Coils are wound from 50 μm diameter enameled copper wire, and bonded inside the transducer casings 83, 86. The inertial mass 96 is made out of two tungsten carbide pieces, machined using electric discharge machining (EDM), and bonded to the suspension spring 89 on either side atop a 1 mm spacer. FIG. 10(*a*) shows the assembled IFPG 80 next to a standard AA-size battery, while FIG. 10(*b*) shows the inside of one of the transducer casings 83, 86 along with an assortment of etched copper springs. Table III shows a summary of the various fabricated and measured IFPG 80 parameters.

TABLE III

| IFPG 80 Summary | |
|---|---|
| Transducer Mass | 0.25 g |
| Transducer Suspension* | 614 N/m |
| Transducer Natural Frequency | 208 Hz |
| Transducer Coil Turns | 2000 |
| Transducer Coil Resistance | 240 Ω |
| Transducer Electrical Q-factor | 97 |
| Transducer Parasitic Q-factor | 50 |
| Transducer Magnet | 3 × 3 × 3 mm |
| Transducer Displacement | 0.5 mm |
| Inertial Mass | 9 g |
| Inertial Mass Suspension Spring* | 135 N/m |
| Actuation Magnet | Dia. 1.15 mm, Thick. 0.5 mm |
| Internal Volume | 2.12 $cm^3$ |
| Total Volume | 3.74 $cm^3$ |
| Min. Acceleration | 0.9 g |
| Max. Power (1 g, 10 Hz) | 288 μW |
| Avg. Power (1 g, 10 Hz) | 5.8 μW |
| Average Power Density | 10.7 $\mu W/cm^3$ |

*Denotes Simulated Value

The above embodiments utilize electromagnetic transducers and a latching/coupling between the inertial mass and the transducers. Other embodiments can use different transducers and/or ways of coupling movement of the inertial mass to the transducers to trigger higher frequency vibration and energy conversion. The force applied to the transducers can be generated magnetically, electrostatically via an electric field, or the force can be generated from surface tension between two interacting materials.

The transducers are the components that actually convert the mechanical energy to electrical. Various different transduction mechanisms can be used to convert this energy into electricity. Typically, this mechanism utilizes the generated strain or relative displacement within the system. In the case of displacement, either the position (electrostatic generation) or velocity (electromagnetic generation) can be used. Alternatively, by utilizing an active material, such as a piezoelectric, deformations (strain) in the mechanical system can also be utilized for transduction. In a typical electromagnetic generator, the mechanism is implemented with a moving magnet linking flux to a stationary coil. As noted above, it is also possible to implement this type of generator with a stationary magnet and moving coil. Piezoelectric generators use a certain type of crystalline material, which becomes electrically polarized when subjected to a mechanical strain, and conversely they can deform due to an applied electric field. Similarly, a hybrid technique exists which uses magnetostriction, which is the shrinking of materials induced by the change in a magnetic field. In this case a material which exhibits a high amount of strain due to a magnetic field change, is bonded with a piezoelectric material. This way a moving magnet, or vice versa the motion of the material relative to the magnet, can be used to strain the magnetostrictive material, which in turn deforms the piezoelectric. Electrostatic generators essentially comprise a capacitor whose plates can move relative to each other. As the conductors move relative to each other, the energy stored in the capacitor changes. Electrostatic generators can also employ an active electret material to pre-charge the capacitor.

An advanced modification can be made to the parametric IFPG architecture by actively tuning the latching force between the inertial mass and the transducer. This may be easiest to achieve in the case that the force is provided electrostatically because the electric field can be controlled easily with a simple circuit, although possible implementations can be found to tune the other latching mechanisms as well.

Figure 11:
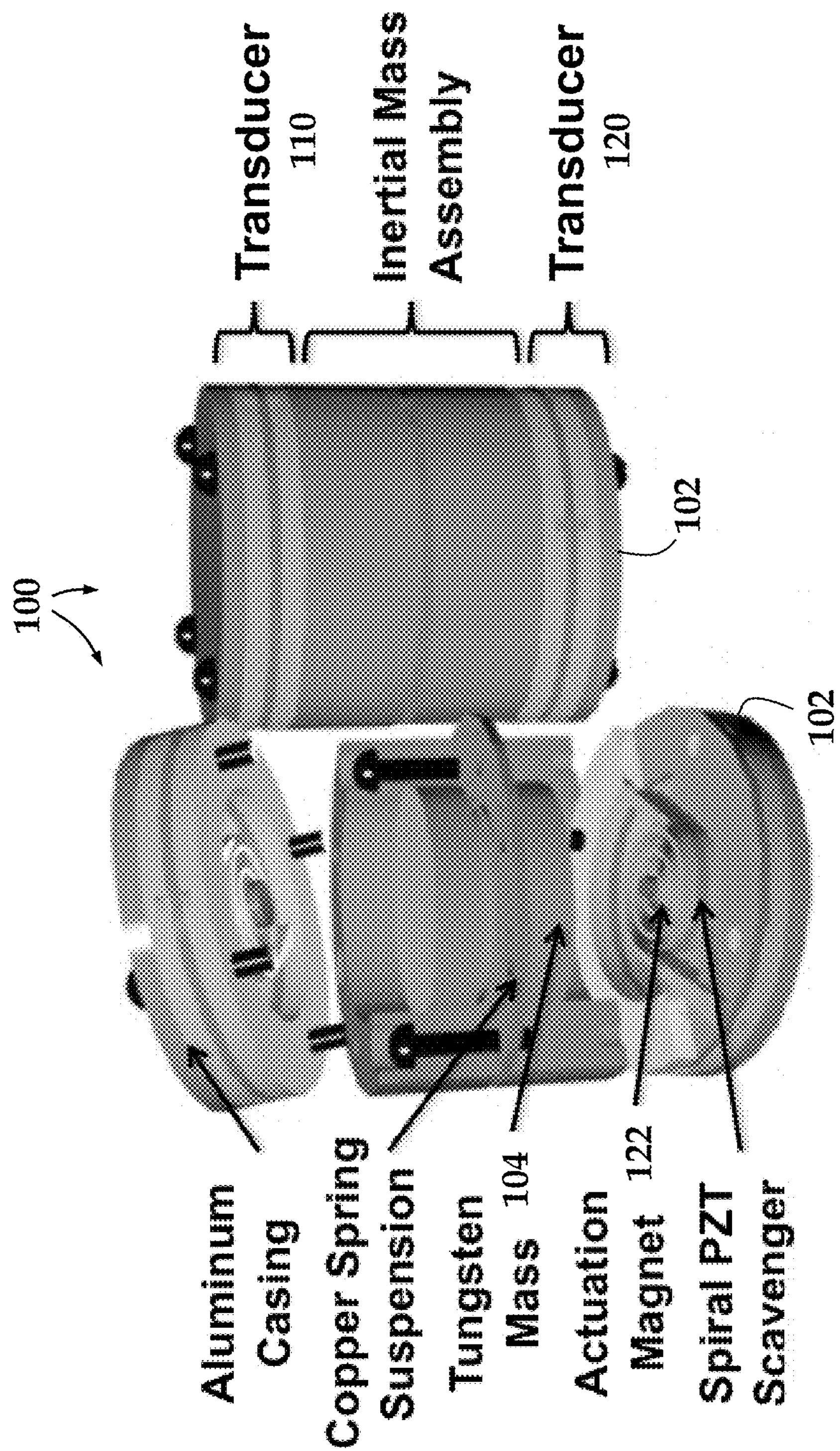
FIG. 11 shows exploded and assembled views of a fifth embodiment of an IFPG constructed in accordance with the invention, wherein a piezoelectric material is used for power generation.

FIG. 11 depicts a fifth embodiment 100 which uses the general arrangement of FIG. 8(*a*), but wherein spiral PZT scavengers or used in lieu of the magnetic core/coil arrangement of IFPG 20. In particular, the IFPG 100 includes a housing 102 formed from multiple aluminum pieces or casings that are stacked together with the PZT scavengers 110, 120 that form the two transducers, as well as with the central inertial mass suspension spring that supports a tungsten mass 104. Each transducer 110, 120 can have a respective actuation magnet 112, 122 and/or ferromagnetic pad (not shown). Vibratory movement of the housing 102 results in movement of the inertial mass 104 relative to the transducers 110, 120, causing alternating deflection of the piezoelectric scavenger as the inertial mass 104 reciprocally snaps back and forth between the two transducers, as will be described in greater detail below. This design of the IFPG 100 can be used to construct a micro-scale piezoelectric generator capable of ≤10 Hz operation. Additional benefits of piezoelectric transduction include: reduced volume, large rectifiable voltage, and the possibility of combining piezoelectric and electromagnetic transduction mechanisms into a single generator.

Figure 12:
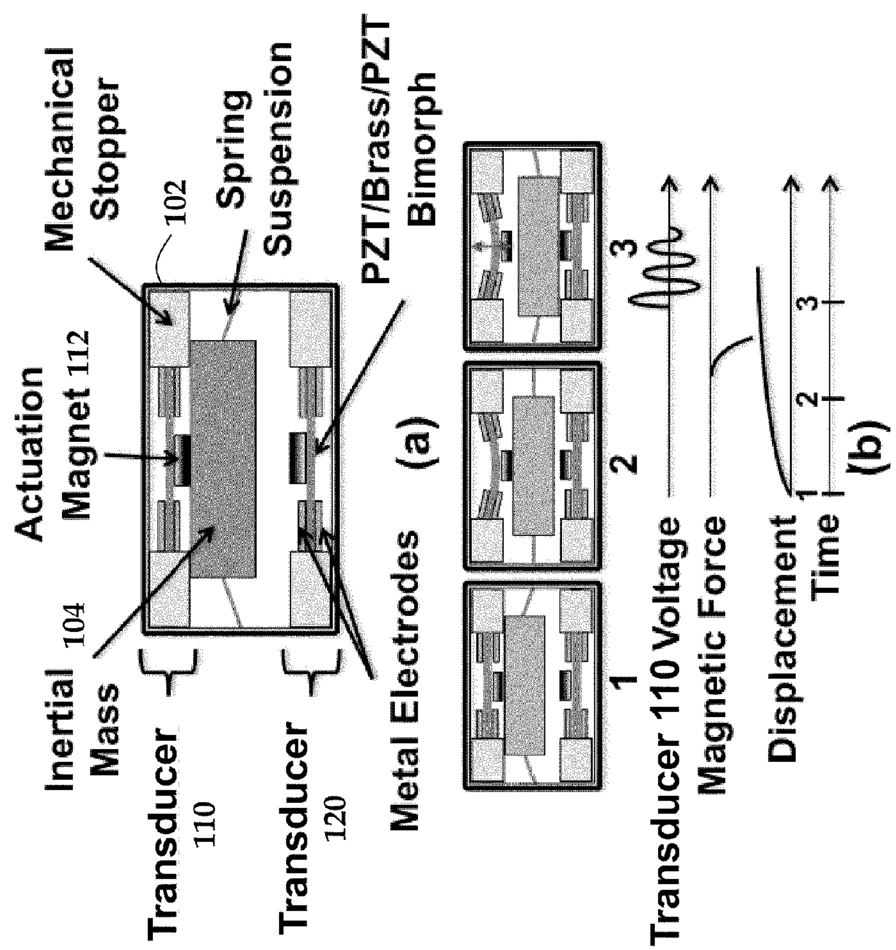
FIG. 12(*a*) is a diagrammatic cross-sectional view of the fifth embodiment of FIG. 11.

A diagrammatic representation of the IFPG 100 is shown in FIG. 12(*a*), and the mechanical operation is similar to that of IFPG 20, as shown in FIG. 12(*b*). The generator 100 operates such that the inertial mass 104 snaps back and forth between the two transducers 110, 120—latching magnetically each time. As the mass 104 moves it pulls the magnetically attached transducer spring along. This action transfers mechanical energy from the inertial mass 104 and stores it in the transducer spring. As the forces on the transducer spring overwhelm the holding magnetic force, the inertial mass 104 detaches and is pulled to the opposing transducer. The freed core of the transducer now resonates at its high natural frequency converting the stored mechanical energy to electrical. By up-converting the ambient vibration frequency to a higher internal operation frequency, the IFPG 100 is able to achieve better electromechanical coupling and efficiency. This entire process is subsequently repeated in the opposite direction and the inertial mass 104 moves from transducer to transducer as long as there is sufficient ambient kinetic energy available.

Each piezoelectric scavenger 110, 120 is designed as a clamped-clamped bimorph beam operating in the 31-mode. This mode of operation offers weaker coupling coefficients, however larger strains can be achieved with a weaker force because of the more compliant configuration. To further decrease the spring constant of the structure while limiting the footprint of the device, the beam is shaped as a spiral. The two arms on the end of the spiral are designed with a linearly increasing cross-section, widening as it moves from the spiral toward the clamped end. This way the high stress concentration at the clamped end is alleviated, improving reliability, and film stress is more evenly distributed across the spiral arms, utilizing more of the PZT material for energy conversion. A commercial lead zirconate titanate (PZT) bimorph is used consisting of a brass shim sandwiched between two sheets of PZT-5A4E, with PZT/Brass/PZT thickness of 130/130/130 μm.

Figure 13:
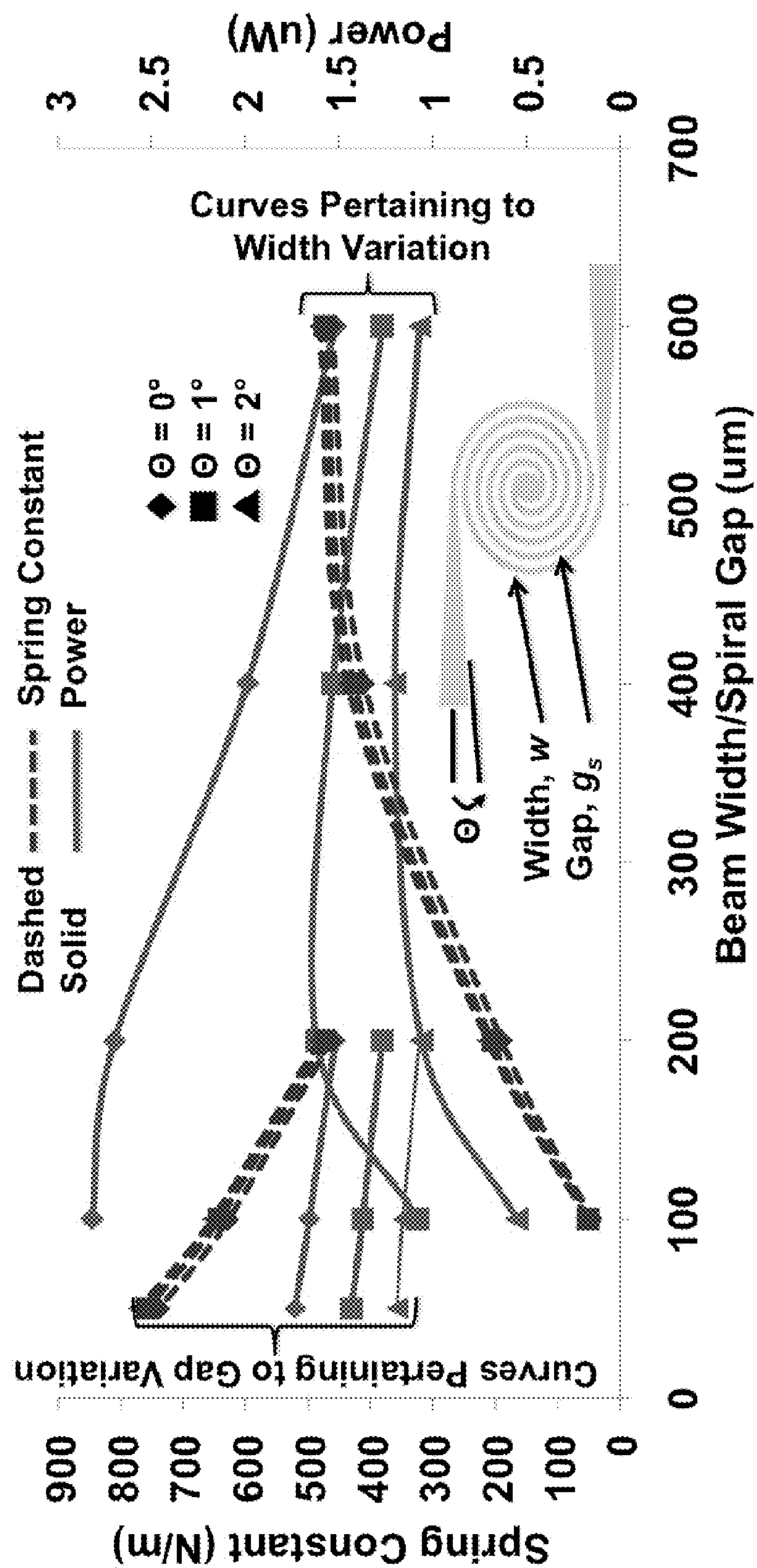
FIGS. 13-15 show various simulation results depicting the influence of various design parameters for the piezoelectric IFPG of FIG. 11.

In order to design the PZT scavenger spiral, coupled field finite element modeling can be performed using ANSYS™, and the influence of a number of geometric properties can be investigated. Those include the width w, arm length $l_a$, and thickness of the PZT layers $t_p$, as well as the number of turns n, the gap between adjacent spiral turns $g_s$, and electrode placement $l_e$. A fixed force in the center, mimicking the one applied by the inertial mass, is used to simulate transducer actuation. In these simulations all but one of the variables were held at a constant baseline while the influence of that one is determined. Simulation results studying the influence of the various parameters are presented in FIGS. 13-15. In FIG. 13, the influence of the spiral gap $g_s$ and beam width w is shown. When the gap increases the spring constant decreases, because the overall spiral length increases (the number of turns is kept fixed). As the stiffness increases, the deflection and consequently the stress for a given force decreases, and power drops. The widening of the spiral also plays a similar role. As the beam widens the stiffness increases and the stress in the beam increases, increasing the scavenged power. However, an optimum point exists because the increasing spring constant ultimately limits the beam deflection. The widening of the arm cross-section is modeled by Θ, the angle made by the spiral arm with its centerline. In all cases the power drops as Θ increases because of a reduction in the maximum stress in the beam.

Figure 14:
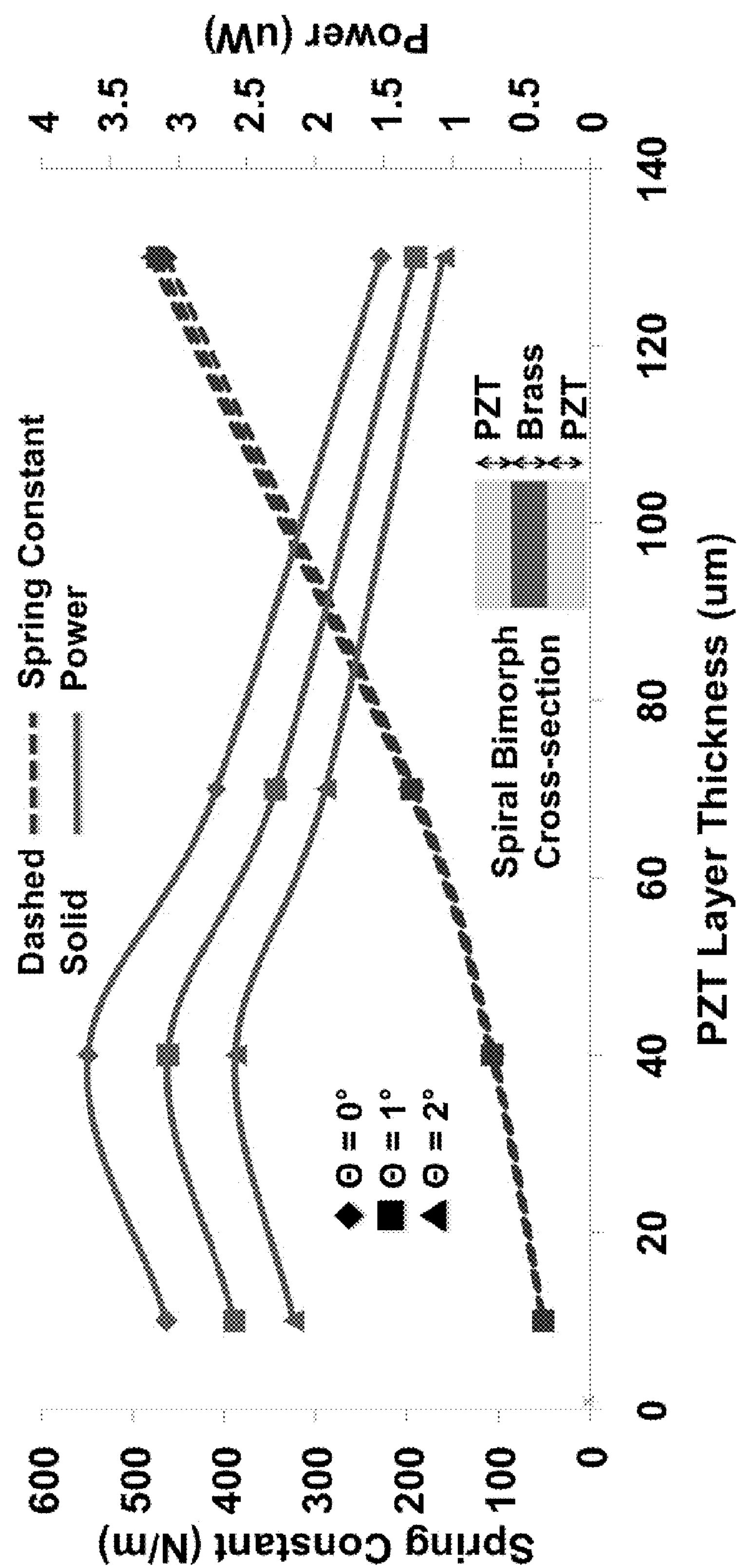
Figure 15:
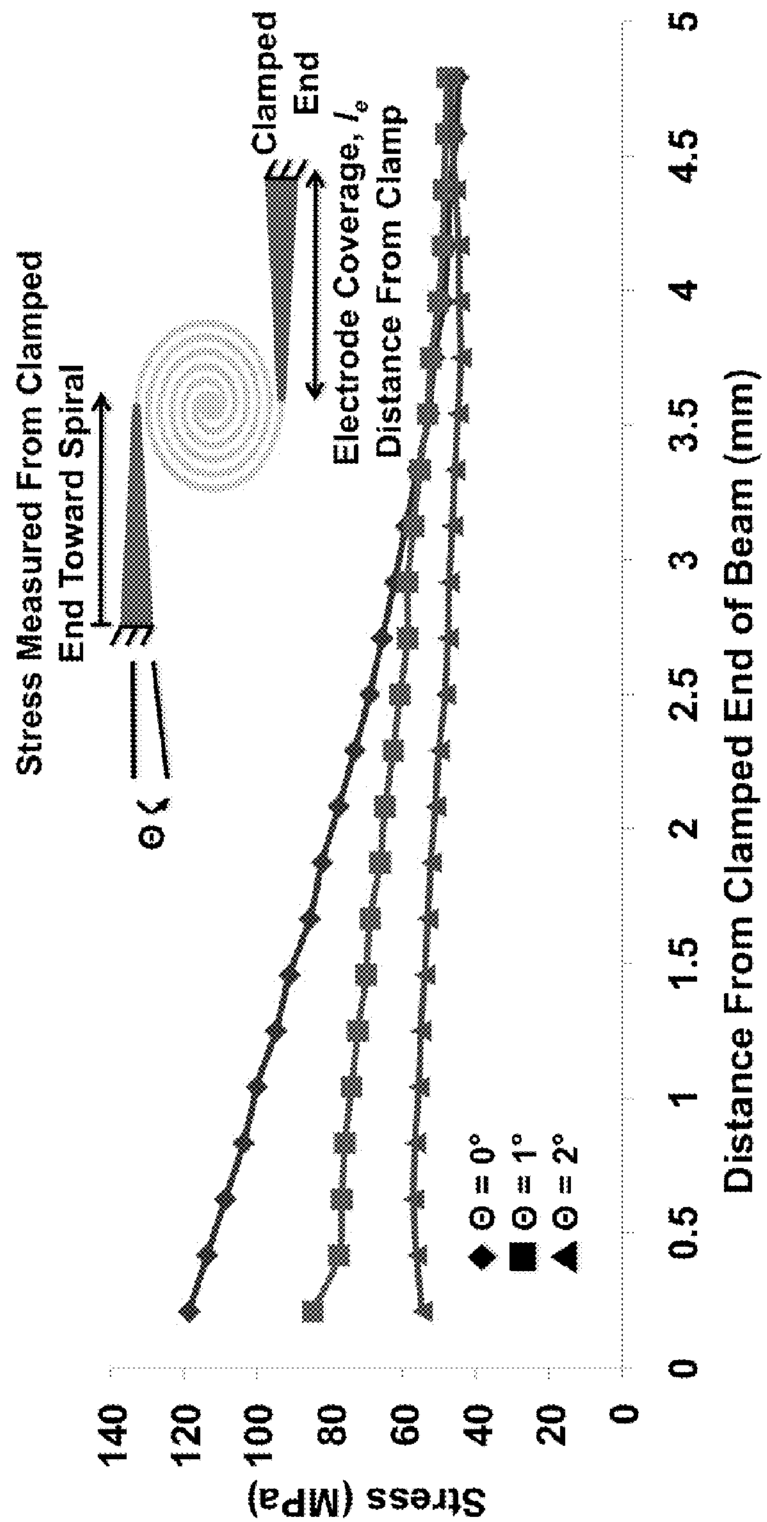

The influence of the thickness $t_p$ of the PZT layer is shown in FIG. 14. One can see that an optimal thickness exists, once again caused by the interplay between spring constant, stress, and deflection. FIG. 15 shows the stress distribution along the two arms of the spiral as the cross section is changed. When the arm becomes gradually wider from center to base, the stress distribution becomes more linear, making the transducer more reliable. The optimal electrode configuration occurs when they are placed only above the spiral arms $l_a=l_e$. Due to the torsional motion associated with the spiral deflection, electrodes placed on the spiral itself will reduce the power due to alternating polarization.

Figure 16:
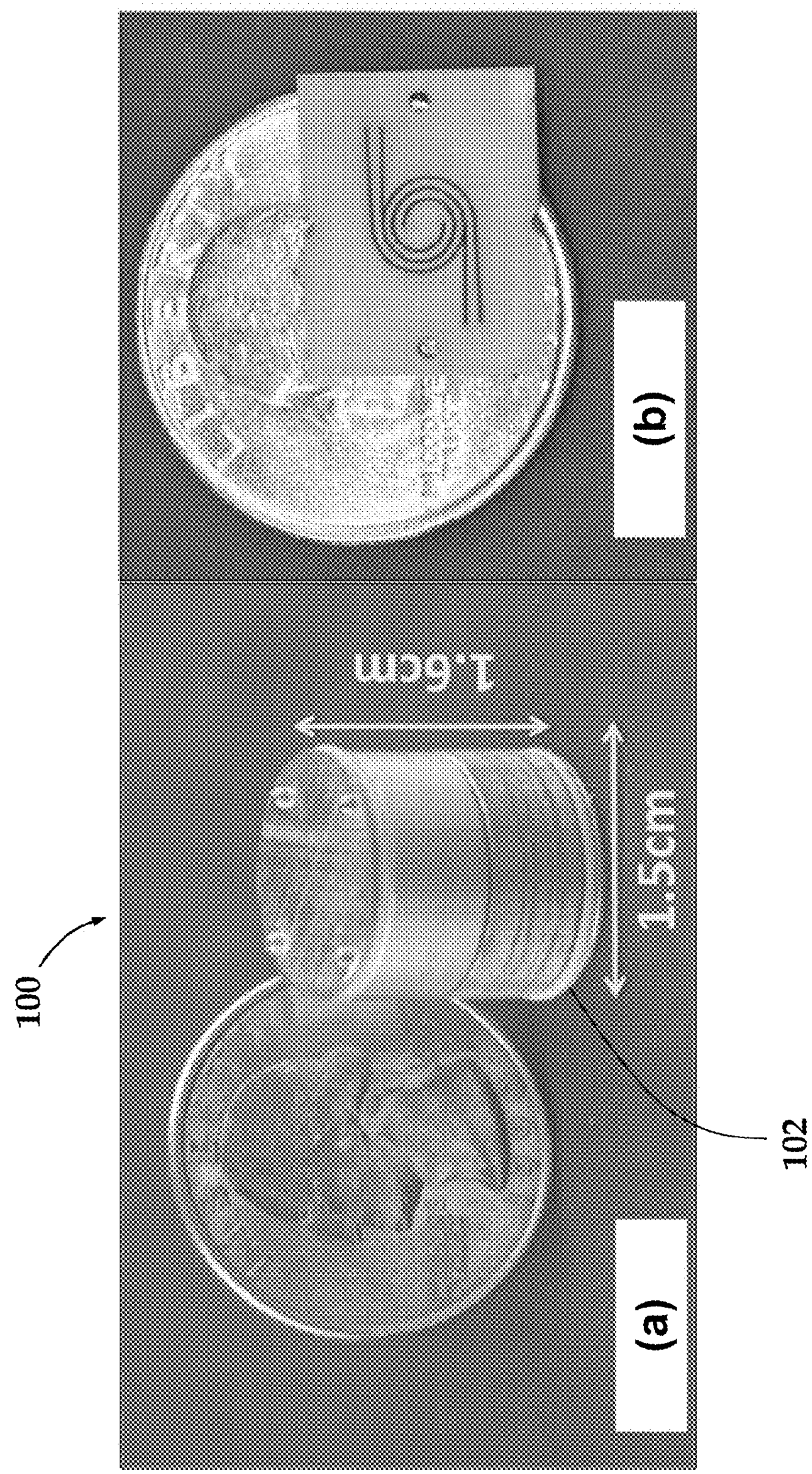
FIG. 16(*a*) is a photograph showing relative size of the assembled IFPG of FIG. 11.

FIG. 16(*a*) shows an image of the manufactured IFPG 100. The generator housing 102 is milled out of aluminum. It consists of four separate parts, bolted together during assembly, clamping down the spring suspensions in the process. The spring for the inertial mass is fabricated out of 127 μm thick copper alloy 110. The copper sheets are mounted on carrier silicon wafers using photoresist, lithographically patterned, and immersion etched in $FeCl_3$ at 45° C. The inertial mass 104 is made out of two tungsten carbide pieces, machined using electric discharge machining (EDM), and bonded to the spring suspension on either side atop a 1 mm spacer.

The PZT layer of each transducer can be ground down to 40 μm on both sides using a lapper, and Cr/Au electrodes are evaporated. The piezoelectric bimorph is then machined using a Ti-Sapphire femto-second laser (wavelength of 780 nm) with a 150 fs pulse duration and a 1 kHz repetition rate. In order to enable complex shape patterning and automated machining of several samples in a serial process, the pieces are placed on a computer controlled XYZ-Φ motion stage, on which the laser beam is focused through a shutter. Compared to other bulk PZT substrate patterning technologies, femtosecond laser machining provides a small feature size with a high aspect ratio, minimum undercut, and less damage to the material. In order to keep stress low, and for structural rigidity reasons the spiral was designed with a width of w=500 μm and gap of $g_s$=50 μm, which after machining resulted in 470 μm and 80 μm respectively. The arm length $l_a$=5 mm; the maximum which could fit in the casing. Due to space constraints, the spiral was also designed with 2 turns. A finished PZT scavenger spiral is shown in FIG. 16(*b*). NdFeB magnets are adhered to the spiral center using cyanoacrylate.

TABLE IV

| IFPG 100 Summary | | |
|---|---|---|
| Inertial Mass | 9 | g |
| Inertial Mass k | 135 | N/m |
| Magnet | Dia. 1.2 | mm |
| Width w | 470 | μm |
| Gap $g_s$ | 80 | μm |
| Arm $l_a$ | 5 | mm |
| Θ | 1° | |
| Thick. $t_p$ | 40, 130 | μm |
| $Z_{out}$ (thick, thin) | 187, 161 | kΩ |
| Spiral # | 2 | |
| $Q_{load}$ (thick, thin) | 56, 96 | |

Figure 17:
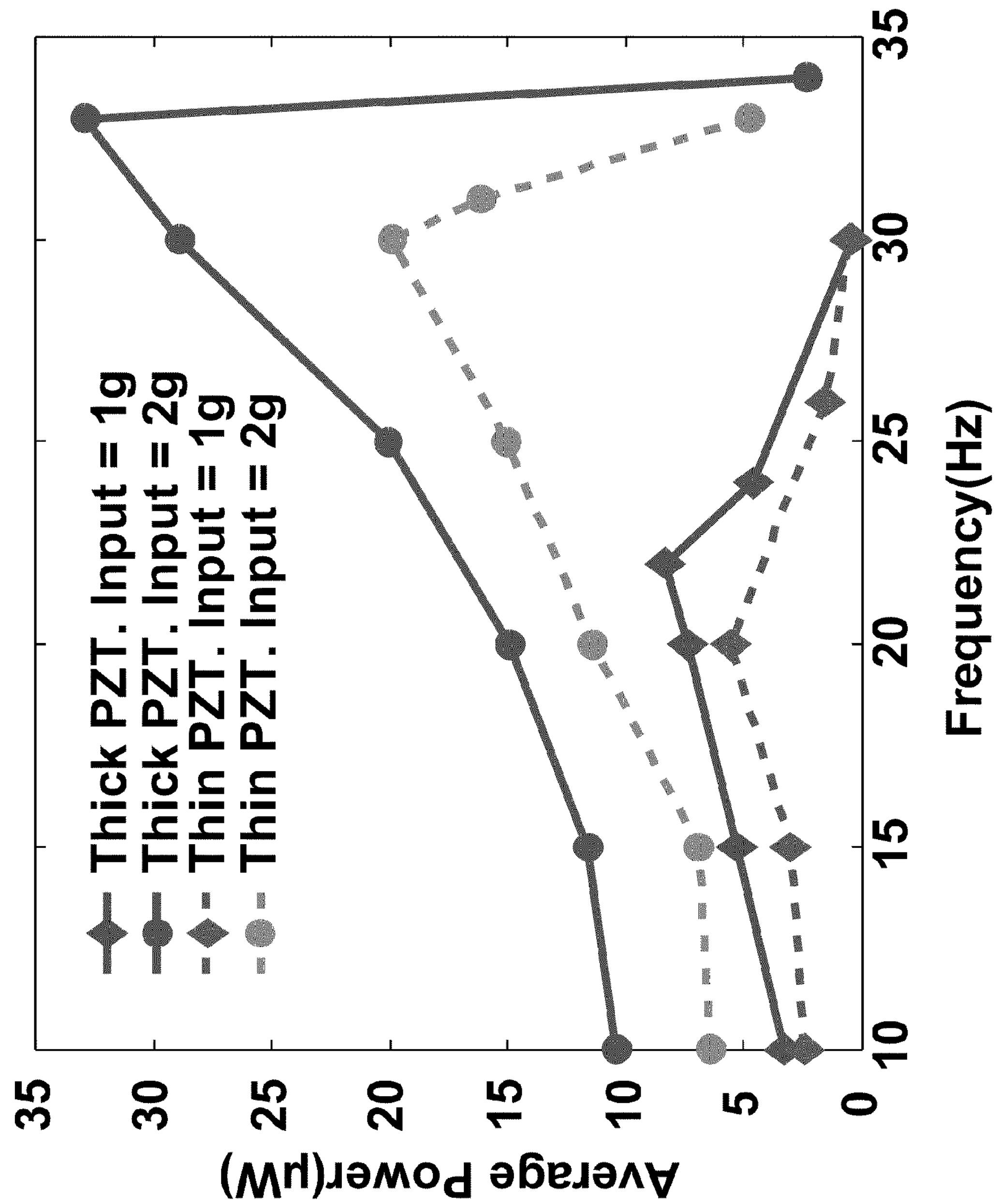
FIG. 17 is a graph characterizing the bandwidth of the piezoelectric IFPG of FIG. 11.

Table IV shows a summary of the various designed and measured IFPG 100 parameters. Two types of transducers were used, one set having the full 130/130/130 μm thickness and one set where each PZT side was lapped down to a thickness of 40 μm. Initial testing was performed to characterize the PZT scavenger devices. Each transducer 110, 120 was mounted on a shaker table and the resonance frequency was found. They were then actuated at resonance while the load impedance was varied in order to determine the optimal load impedance. This data is included in Table IV. The IFPG 100 was assembled and tested at a number of amplitudes (minimum operating threshold for this design is 6.86 $m/s^2$). The minimum frequency at which the generator could be tested accurately is 10 Hz due to limitations associated with the vibration test system. Each transducer was loaded with its optimal impedance and the voltage across this impedance is monitored. Considerable non-linearity was noticed, caused by the large bimorph deflections. The full thickness PZT scavengers generated 3.25 μW of average power when actuated at 1 g with a frequency of 10 Hz, while the thinned down samples produced 2.44 μW from the same input. It was expected that thinning down the PZT transducers would increase the generated power significantly. However, in this first attempt the transducers containing the thinned bimorphs produced less power. This is likely due to one of several factors including, micro-cracks developing during lapping, roughness and poor electrical contact, and/or excessive heating during laser machining and degradation of the material properties. The bandwidth of the IFPG 100 is determined primarily by the resonant frequency of the inertial mass and its spring suspension. To determine this cutoff, the input vibration frequency can be increased until the PFIG stops functioning. It was found that the tested generator 100 could function up to a frequency of 24 Hz at 9.8 $m/s^2$. A complete characterization of the bandwidth of the IFPG device 100 is shown in FIG. 17.

It is to be understood that the foregoing is a description of exemplary embodiments of the invention. The invention is not limited to the particular embodiments disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiments will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. An electrical power generator, comprising:

a housing;

an inertial mass mounted in said housing, said inertial mass being capable of at least limited movement within said housing in response to vibration of said housing; and a transducer mounted within said housing and being coupled to said inertial mass such that said transducer undergoes oscillatory motion in response to the movement of said inertial mass resulting from the vibration, wherein said transducer is an electromagnetic transducer comprising a solenoid coil encircling a magnetic core, said coil being fixed within said housing and said core being suspended within said housing such that said core can be magnetically coupled to said inertial mass for concomitant movement with said inertial mass in response to the vibration, and can be substantially magnetically decoupled from said inertial mass during at least a portion of the movement of said inertial mass wherein said decoupled core undergoes the oscillatory motion relative to said coil to thereby induce current in said coil.

2. An electrical power generator as defined in claim 1, wherein said transducer comprises a first electromagnetic transducer, and wherein said power generator further comprises a second electromagnetic transducer, said first transducer being positioned within said housing on a first side of said inertial mass and said second transducer being positioned within said housing on an opposite side of said inertial mass, wherein said inertial mass is suspended within said housing between said first and second transducers such that said inertial mass can be magnetically coupled to only one of said transducers at a time and is capable of alternately coupling and decoupling with each transducer in response to the vibration imparted on said housing.

3. An electrical power generator as defined in claim 2, wherein said inertial mass and said cores of said transducers are positioned along a common axis such that said inertial mass and cores move along said axis in response to at least a component of the vibration that extends parallel to said axis.

4. An electrical power generator as defined in claim 1, further comprising a magnet carried by said inertial mass such that said inertial mass magnetically couples to said transducer at least in part using the magnetic field of said magnet.

5. An electrical power generator as defined in claim 1, wherein said core is suspended within said housing such that said suspended core has a resonant frequency of vibration.

6. An electrical power generator as defined in claim 1, wherein said transducer is an increased-frequency transducer that generates electrical current in response to motion of said inertial mass resulting from low frequency vibrations imparted on said housing.

7. An electrical power generator, comprising:

a housing;

an inertial mass mounted in said housing, said inertial mass being capable of at least limited movement within said housing in response to vibration of said housing; and a transducer mounted within said housing and being coupled to said inertial mass such that said transducer undergoes oscillatory motion in response to the movement of said inertial mass resulting from the vibration, wherein said transducer is an electromagnetic transducer comprising a moving coil encircling a magnetic core, said core being fixed within said housing and said coil being suspended within said housing such that said coil can be coupled to said inertial mass and can undergo oscillatory motion relative to said core in response to the movement of said inertial mass.

8. An electrical power generator, comprising:

a housing;

an inertial mass mounted in said housing, said inertial mass being capable of at least limited movement within said housing in response to vibration of said housing; and a transducer mounted within said housing and being coupled to said inertial mass such that said transducer undergoes oscillatory motion in response to the movement of said inertial mass resulting from the vibration, wherein said transducer is an electrostatic element having a variable capacitance and wherein the movement of said inertial mass varies the capacitance of said electrostatic element.

9. An electrical power generator as defined in claim 8, wherein said electrostatic element comprises a capacitive electrostatic device.

10. An electrical power generator as defined in claim 8, wherein said electrostatic element comprises an active electret material.

11. An electrical power generator, comprising:

a housing;

an inertial mass mounted in said housing, said inertial mass being capable of at least limited movement within said housing in response to vibration of said housing; and a transducer mounted within said housing and being coupled to said inertial mass such that said transducer undergoes oscillatory motion in response to the movement of said inertial mass resulting from the vibration, wherein said transducer includes a magnetostrictive material attached to a piezoelectric element such that a change in magnetic field impinging on the magnetostrictive material induces strain in the piezoelectric element.

12. An increased frequency power generator, comprising:

a housing;

an inertial mass mounted in said housing, said inertial mass being capable of at least limited movement within said housing in response to low frequency vibration of said housing; and first and second transducers mounted in said housing, said first transducer being positioned within said housing adjacent a first side of said inertial mass and said second transducer being positioned within said housing adjacent a second side of said inertial mass, wherein said inertial mass is suspended within said housing between said first and second transducers such that said inertial mass can be magnetically coupled to only one of said transducers at a time and is capable of alternately coupling and decoupling with each transducer in response to the vibration imparted on said housing;

wherein said transducers each includes at least one magnetic element suspended within said housing for oscillatory movement upon decoupling of said inertial mass from that transducer; and wherein each suspended magnetic element vibrates upon decoupling at a frequency that is greater than the low frequency vibration.

13. An increased frequency power generator as defined in claim 12, wherein said transducer comprises at least one coil and said magnetic element, wherein said magnetic element is suspended within said housing for oscillatory motion relative to said coil(s), and wherein said magnetic element is positioned in close proximity to said coil(s) such that an electric current is induced in said coil(s) in response to the relative oscillatory motion.

14. An increased frequency power generator as defined in claim 12, wherein each transducer comprises a piezoelectric material mounted within said housing such that oscillatory movement of said magnetic element causes strain in said piezoelectric material sufficient to generate a voltage across said piezoelectric material.

15. An increased frequency power generator as defined in claim 14, wherein each transducer includes a beam formed at least in part from said piezoelectric material, with said magnetic element being suspended within said housing via said beam.

16. An increased frequency power generator as defined in claim 12, wherein said inertial mass is suspended within said housing between said transducers via a metal suspension spring.

17. An increased frequency power generator as defined in claim 12, wherein said magnetic elements of each transducer comprise a permanent magnet.

18. An increased frequency power generator as defined in claim 12, wherein said inertial mass includes a magnet.

* * * * *